(12) United States Patent
Ogawa et al.

(10) Patent No.: US 6,750,158 B2
(45) Date of Patent: Jun. 15, 2004

(54) METHOD FOR PRODUCING A SEMICONDUCTOR DEVICE

(75) Inventors: Masahiro Ogawa, Higashiosaka (JP); Daisuke Ueda, Ibaraki (JP); Masahiro Ishida, Hirakata (JP); Masaaki Yuri, Ibaraki (JP); Hirokazu Shimizu, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/145,144

(22) Filed: May 15, 2002

(65) Prior Publication Data

US 2002/0173064 A1 Nov. 21, 2002

(30) Foreign Application Priority Data

May 18, 2001 (JP) ......................................... 2001-149098

(51) Int. Cl.[7] .............................................. H01L 21/26
(52) U.S. Cl. ........................... 438/795; 438/36; 438/46; 438/796; 438/797; 438/798; 438/799; 438/977
(58) Field of Search ............................... 438/22–32, 42, 438/46, 47

(56) References Cited

U.S. PATENT DOCUMENTS 6,071,795 A    6/2000  Cheung et al.
6,303,405 B1 * 10/2001  Yoshida et al. ............... 438/46

* cited by examiner

Primary Examiner—Long Pham
Assistant Examiner—Wai-Sing Louie
(74) Attorney, Agent, or Firm—Nixon Peabody LLP; Donald R. Studebaker

(57) ABSTRACT

A first semiconductor layer is formed on a mother substrate, and the mother substrate is irradiated with irradiation light from a surface opposite to the first semiconductor layer, so that a thermally decomposed layer formed by thermally decomposing the first semiconductor layer between the first semiconductor layer and the mother substrate. Then, a second semiconductor layer including an active layer is formed on the first semiconductor layer in which the thermally decomposed layer is formed.

12 Claims, 8 Drawing Sheets

METHOD FOR PRODUCING A SEMICONDUCTOR DEVICE

BACKGROUND OF THE INVENTION

The present invention relates to a method for producing a semiconductor device such as a semiconductor light-emitting device or a field effect transistor.

III–V nitride semiconductors typified by gallium nitride (GaN), aluminum nitride (AlN) or indium nitride (InN) (hereinafter, referred to as nitride semiconductor) are materials whose band gap is in a wide range from 1.9 eV to 6.2 eV and can cover a wavelength band from infrared light to ultraviolet light.

In general, sapphire (monocrystal $Al_2O_3$) is used as a substrate in which a nitride semiconductor is grown. Although there is large lattice mismatch between sapphire and a nitride semiconductor, high quality crystal can be obtained by providing a low temperature buffer layer between the substrate made of sapphire and the nitride semiconductor layer. As a result, a light-emitting diode element made of the nitride semiconductor formed on the sapphire substrate is commercially available at present.

Since the nitride semiconductor has a large breakdown voltage, the nitride semiconductor can be expected to be applied, not only as a semiconductor light-emitting device employing the nitride semiconductor, but also as a semiconductor device that can be operated at a large power, and can withstand high temperature operations during large power operation.

However, as described above, in the semiconductor device in which a semiconductor element is formed on a substrate made of sapphire, the characteristics of sapphire itself causes various problems.

First, a stress generated by the difference in the thermal expansion coefficient between the nitride semiconductor and sapphire adversely affects the element. This stress inevitably occurs when the nitride semiconductor layer is epitaxially grown on the substrate in a comparatively high temperature atmosphere, and then the temperature is returned to room temperature.

Secondly, sapphire has a high hardness and is chemically stable, so that processing such as etching or polishing is difficult. For example, when a wafer in which an element is formed is divided into chips by dicing, cracks are likely to occur in the divided chips, and cleavage is difficult to perform. In addition, although the substrate constitutes the major part of the volume of a chip itself, it cannot be separated nor removed, and therefore it is difficult to achieve compactness and thinness.

Thirdly, sapphire is an insulator, it is impossible to form electrodes directly on the substrate. Therefore, it is necessary to form a positive electrode and a negative electrode on an epitaxial layer, and to mount a semiconductor device by a flip-chip technique, which results in a large element area.

Fourthly, sapphire has a small thermal conductivity, so that the heat release properties from the substrate is poor and the temperature characteristics of the semiconductor device cannot be improved.

SUMMARY OF THE INVENTION

Therefore, in view of the conventional problems, it is an object of the present invention to achieve that a stress applied to a semiconductor layer from a mother substrate on which the semiconductor layer is grown can be reduced reliably, and that the mother substrate can be separated from the semiconductor layer easily.

In order to achieve the above object, the present invention provides a method for producing a semiconductor device including forming a thermally decomposed layer formed by thermally decomposing a first semiconductor layer between the first semiconductor layer grown on a mother substrate and the mother substrate before growing a second semiconductor layer including an active layer.

More specifically, a method for producing a semiconductor device of the present invention includes a first step of forming a first semiconductor layer on a mother substrate; a second step of forming a thermally decomposed layer formed by thermally decomposing the first semiconductor layer between the first semiconductor layer and the mother substrate by irradiating the mother substrate with irradiation light from the surface opposite to the first semiconductor layer; and a third step of forming a second semiconductor layer including an active layer on the first semiconductor layer in which the thermally decomposed layer is formed.

According to the method for producing a semiconductor device of the present invention, the thermally decomposed layer ensures that the stress applied from the mother substrate to the first semiconductor layer when the second semiconductor layer is formed on the first semiconductor layer and then the mother substrate provided with the second semiconductor layer is cooled back to room temperature, which is caused by the difference in the thermal expansion coefficient between the mother substrate and the first semiconductor layer, can be reduced. Consequently, defects such as cracks occurring in the second semiconductor layer including the active layer can be prevented, so that the yield can be improved.

It is preferable that the method for producing a semiconductor device of the present invention further includes a fourth step, between the first step and the second step, of forming a mask film on the first semiconductor layer, the mask layer being made of a material that substantially prevents the second semiconductor layer from being grown and having a plurality of openings.

It is preferable that the method for producing a semiconductor device of the present invention further includes a fourth step, before the first step, of forming a mask film on the mother substrate, the mask layer being made of a material that substantially prevents the first semiconductor layer from being grown and having a plurality of openings.

It is preferable that the method for producing a semiconductor device of the present invention further includes a fifth step, after the third step, of separating the mother substrate from the first semiconductor layer by removing the thermally decomposed layer.

In this case, it is preferable that the method for producing a semiconductor device of the present invention further includes a sixth step, after the fifth step, of forming an electrode on the surface of the first semiconductor layer opposite to the second semiconductor layer.

In the method for producing a semiconductor device of the present invention, it is preferable that the first semiconductor layer is made of a compound semiconductor containing a nitride.

In the method for producing a semiconductor device of the present invention, it is preferable that the second semiconductor layer is made of a compound semiconductor containing a nitride.

In the method for producing a semiconductor device of the present invention, it is preferable that the first semiconductor layer is a contact layer of the second semiconductor layer.

In the method for producing a semiconductor device of the present invention, it is preferable that the first semiconductor layer is a cladding layer of the second semiconductor layer.

In the method for producing a semiconductor device of the present invention, it is preferable that the first semiconductor layer is a compound semiconductor made of a p-type nitride.

In the method for producing a semiconductor device of the present invention, it is preferable that the irradiation energy of the irradiation light is about 0.1 J/cm$^2$ or more and about 20 J/cm$^2$ or less. This ensures that the mother substrate and the first semiconductor layer are attached by the thermally decomposed layer formed by thermally decomposing the first semiconductor layer.

In this case, it is preferable that the wavelength of the irradiation light is longer than the absorption edge of the forbidden band of a material constituting the mother substrate and is shorter than the absorption edge of the forbidden band of a material constituting the first semiconductor layer.

DETAILED DESCRIPTION OF THE INVENTION

First Embodiment

A first embodiment of the present invention will be described with reference to the accompanying drawings.

FIGS. 1A to 1E are cross-sectional views showing the process sequence in a method for producing a light-emitting diode device, which is a semiconductor device of a first embodiment of the present invention.

Figure 1A:
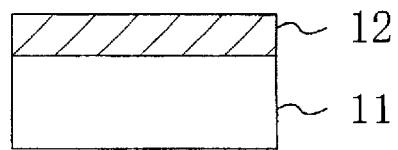
FIGS. 1A to 1E are cross-sectional views showing the process sequence in a method for producing a semiconductor device of a first embodiment of the present invention.

First, as shown in FIG. 1A, a buffer layer (not shown) made of gallium nitride (GaN) having a thickness of about 20 nm and an n-type contact layer 12 made of gallium nitride doped with silicon (Si), which is an n-type impurity, having a thickness of about 5 $\mu$m are sequentially grown on a mother substrate 11 made of sapphire having an orientation of the principal plane of (0001) plane (=C plane) by, for example, a growth apparatus using organometallic vapor phase epitaxial growth (MOVPE) (hereinafter, referred to as MOVPE apparatus). The diameter of the mother substrate 11 is for example, about 5.1 cm (2 inches), and the thickness thereof is about 300 $\mu$m. For the convenience of the drawings, only a part of a wafer is shown as the mother substrate 11. The n-type contact layer 12 is configured so as to include a buffer layer, and the n-type contact layer 12 and semiconductor layers grown thereon that are grown on the mother substrate 11 are referred to as "an epitaxial substrate", including the mother substrate 11. Furthermore, the semiconductor layers that are left after the mother substrate 11 is removed from the epitaxial substrate are referred to as "an epitaxial layer". The same is true in the following embodiments.

Figure 1B:
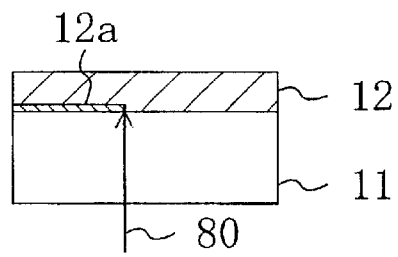

As shown in FIG. 1B, after the epitaxial substrate is taken out of the reaction chamber of the MOVPE apparatus, the mother substrate 11 is irradiated with laser light 80 from the surface opposite to the n-type contact layer 12, so that a thermally decomposed layer 12a obtained by thermally decomposing the n-type contact layer 12 is formed at the interface of the n-type contact layer 12 with the mother substrate 11. As the laser light 80, for example, the third harmonics having a wavelength of 355 nm of so-called Nd:YAG laser light, which can be obtained from crystals made of YAG (yttrium aluminum garnet) to which neodymium ions (Nd$^{3+}$) are added, is used. The irradiation energy at this time is about 0.3 J/cm$^2$, the interval between pulses is about 5 ns, and the spot diameter of the laser light 80 during irradiation is about 100 $\mu$m.

Sapphire is transparent with respect to the laser light 80, and therefore the light cannot be absorbed by the mother substrate 11. On the other hand, the wavelength of the absorption edge in the forbidden band of gallium nitride is about 360 nm to 364 nm, so that the wavelength of the laser light 80 is shorter and therefore the laser light 80 is absorbed in the n-type contact layer 12. This absorption causes the n-type contact layer 12 to be thermally decomposed into metal gallium (Ga) and nitrogen (N$_2$) gas.

Figure 1C:
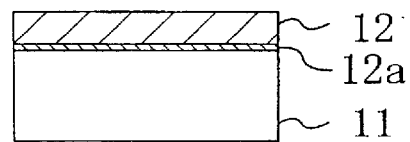

Therefore, as shown in FIG. 1C, when the entire surface of the n-type contact layer 12 is irradiated with the laser light 80, the mother substrate 11 and the n-type contact layer 12 are attached while being in a melted state if the temperature is equal to or more than the melting point (about 30° C.) of the thermally decomposed layer 12a made of the metal gallium. In order to maintain the attachment state without the mother substrate 11 and the n-type contact layer 12 being not completely separated, the thermally decomposed layer 12a should be generated in a suitable amount, and the suitable amount is determined by the irradiation energy of the laser light 80. In this embodiment, the value of the irradiation energy of the laser light 80 is set to about 0.1 J/cm$^2$ or more and about 20 J/cm$^2$ or less.

Figure 1D:
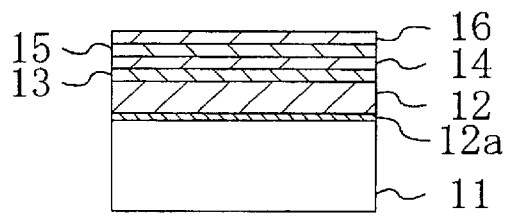

Next, as shown in FIG. 1D, the epitaxial substrate with the n-type contact layer 12 attached is introduced again to the reaction chamber of the MOVPE apparatus, so that n-type gallium nitride is further grown on the n-type contact layer 12 so as to increase the thickness of the n-type contact layer 12 to about 20 $\mu$m. Then, an n-type barrier layer 13 made of n-type aluminum gallium nitride (Al$_{0.3}$Ga$_{0.7}$N) doped with silicon having a thickness of about 0.1 $\mu$m, a light-emitting layer 14 made of undoped indium gallium nitride (In$_{0.2}$Ga$_{0.8}$N) having a thickness of about 2 nm, a p-type barrier layer 15 made of p-type aluminum gallium nitride (Al$_{0.3}$Ga$_{0.7}$N) doped with magnesium (Mg) having a thickness of about 0.1 $\mu$m, and a p-type contact layer 16 made of p-type gallium nitride doped with magnesium having a thickness of about 0.5 $\mu$m are sequentially grown on the n-type contact layer 12. Thus, a light-emitting diode element having a single quantum well structure in which the light emitting layer 14 is sandwiched by the n-type barrier layer 13 and the p-type barrier layer 15 is formed.

Figure 1E:
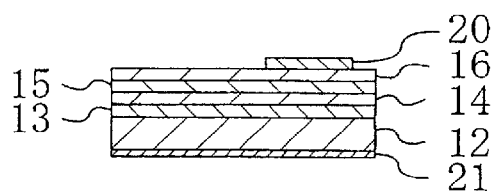

Next, as shown in FIG. 1E, after the epitaxial substrate in which all the layers up to the p-type contact layer 16 have been grown is taken out of the reaction chamber and cooled to room temperature, a positive electrode 20 made of a laminated film of nickel (Ni) and gold (Au) having a thickness of about 1 $\mu$m is formed selectively on the p-type contact layer 16 by an evaporation method. Then, although not shown, a holding material made of an adhesive tape material, a glass material, a resist material or other materials that are hardly dissolved in hydrochloric acid (HCl) is attached, applied or plated onto the positive electrode 20 and the p-type contact layer 16 in order to facilitate the handling of the epitaxial layer after the mother substrate 11 is removed. Thereafter, the thermally decomposed layer 12a is removed with hydrochloric acid, so that the mother substrate 11 is separated from the n-type contact layer 12. Then, a negative electrode 21 made of a laminated film of titanium (Ti) and aluminum (Al) having a thickness of about 1 $\mu$m is formed by an evaporation method on the surface of the n-type contact layer 12 to which the thermally decomposed layer 12a was attached. Then, a light-emitting device can be obtained by dividing the epitaxial layer into about 300 $\mu$m square chips, using a dicer. In this embodiment, output light having a wavelength of 450 nm is obtained by applying a voltage across the positive electrode 20 and the negative electrode 21. The holding material is removed before or after the process for dividing the epitaxial layer in the form of a wafer into chips.

Here, the order of the formation of the positive electrode 20 and the negative electrode 21 does not matter. More specifically, when forming the negative electrode 21 before the positive electrode 20, first, the holding material is attached or applied onto the upper surface of the p-type contact layer 16, and the mother substrate 11 is separated. Thereafter, the negative electrode 21 is formed on the back surface of the n-type contact layer 12. Thereafter, the holding material is removed and the positive electrode 20 is formed on the p-type contact layer 16.

Thus, according to the first embodiment, a lower portion of the n-type contact layer 12 is formed on the mother substrate 11, and then the mother substrate 11 is irradiated with the laser light 80 from the surface opposite to the n-type contact layer 12, so that the thermally decomposed layer 12a obtained by thermally decomposing the n-type contact layer 12 is formed at the interface of the n-type contact layer 12 with the mother substrate 11. Therefore, the stress applied from the mother substrate 11 to the n-type contact layer 12 when the n-type contact layer 12 is grown again, the n-type barrier layer 13, the light-emitting layer 14, the p-type barrier layer 15 and the p-type contact layer 16 are grown and then the epitaxial substrate is cooled back to room temperature, which is caused by the difference in the thermal expansion coefficient between the mother substrate 11 and the n-type contact layer 12, can be reduced by the thermally decomposed layer 12a. Consequently, the strain applied to the light-emitting layer 14 during cooling can be reduced, so that the piezoelectric effect, which causes the recombination probability between electrons and holes to be reduced, can be decreased, and therefore the light-emitting efficiency can be improved. Furthermore, defects such as cracks occurring in the epitaxial layer can be prevented.

Furthermore, the mother substrate 11 made of sapphire, which is hardly subjected to processing, is removed and then dicing is performed, so that the wafer can be divided into chips easily without cracks or fractures occurring, thus improving the yield.

Furthermore, since the mother substrate 11, which is an insulator, is removed, the negative electrode 21 can be formed so as to oppose the positive electrode 20 on the surface of the n-type contact layer 12 opposite to the light-emitting layer 14, so that the chip area can be reduced.

Furthermore, since the mother substrate 11 having a small thermal conductivity is removed, the heat release properties of the epitaxial layer are improved, so that the temperature characteristics as a light-emitting diode device can be improved.

As the laser light 80, an excimer laser light having a wavelength of 248 nm with krypton fluoride (KrF) can be used instead of the third harmonics of Nd:YAG laser light.
Second Embodiment Hereinafter, a second embodiment of the present invention will be described with reference to the accompanying drawings.

FIGS. 2A to 2E are cross-sectional views showing the process sequence in a method for producing a light-emitting diode device, which is a semiconductor device of a second embodiment of the present invention.

Figure 2A:
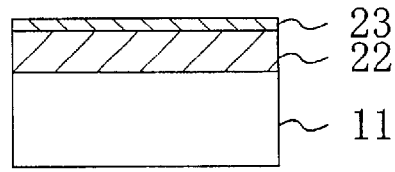
FIGS. 2A to 2E are cross-sectional views showing the process sequence in a method for producing a semiconductor device of a second embodiment of the present invention.

First, as shown in FIG. 2A, for example, a mother substrate 11 made of sapphire having the C plane as its principal plane and having a thickness of about 300 $\mu$m is introduced into a MOVPE apparatus, and a buffer layer (not shown) made of gallium nitride (GaN) having a thickness of about 20 nm, a p-type contact layer 22 made of gallium nitride doped with magnesium, which is a p-type impurity, having a thickness of about 5 $\mu$m, and a p-type barrier layer 23 made of p-type aluminum gallium nitride ($Al_{0.3}Ga_{0.7}N$) doped with magnesium having a thickness of 0.1 $\mu$m are sequentially grown on the principal plane of the introduced mother substrate 11.

Figure 2B:
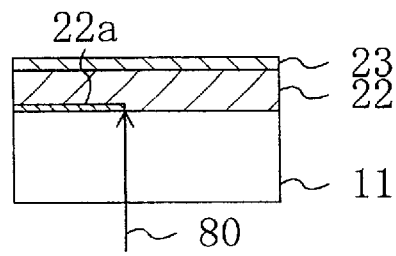
Figure 2C:
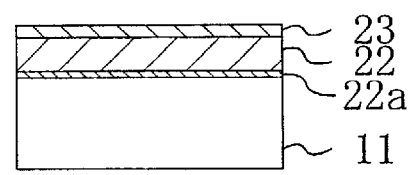

As shown in FIG. 2B, after the epitaxial substrate is taken out of a reaction chamber of the MOVPE apparatus, the mother substrate 11 is irradiated with laser light 80 from the surface opposite to the p-type contact layer 22, so that a thermally decomposed layer 22a obtained by thermally decomposing the p-type contact layer 22 is formed at the interface of the p-type contact layer 22 with the mother substrate 11. As the laser light 80, for example, the third harmonics of Nd:YAG laser light or KrF excimer laser light is used The irradiation energy at this time is about 0.3 J/cm$^2$, the interval between pulses is about 5 ns, and the spot diameter of the laser light 80 during irradiation is about 100 $\mu$m. The laser light 80 is absorbed in the p-type contact layer 22, and this absorption causes the p-type contact layer 22 to be thermally decomposed into metal gallium and nitrogen gas. Therefore, when the entire surface of the p-type contact layer 22 is scanned by the laser light 80, as shown in FIG. 2C, the mother substrate 11 and the p-type contact layer 22 are attached by the thermally decomposed layer 22a.

In the second embodiment, after the p-type contact layer 22 and the p-type barrier layer 23 are grown on the mother substrate 11, the p-type contact layer 22 is irradiated with the laser light 80. Therefore, the p-type contact layer 22 and the p-type barrier layer 23 are heated by the absorption of the laser light 80. Consequently, hydrogen (H), which causes deactivation of the p-type acceptor made of magnesium, is desorbed from the p-type contact layer 22 and the p-type barrier layer 23, so that the p-type acceptor becomes active. In addition, there is an effect that the laser light 80 cleaves directly the bonding between magnesium and hydrogen. Furthermore, the value of the irradiation energy of the laser light 80 is set to about 0.1 J/cm$^2$ or more and about 20 J/cm$^2$ or less, so that the mother substrate 11 is not completely separated from the p-type contact layer 22.

Figure 2D:
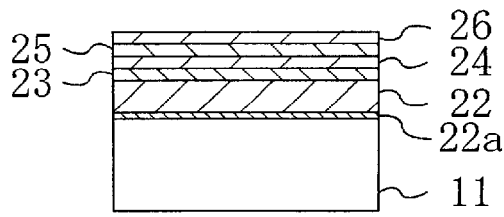

Next, as shown in FIG. 2D, the epitaxial substrate with the p-type contact layer 22 and the p-type barrier layer 23 attached is introduced again to the reaction chamber of the MOVPE apparatus. Then, a light-emitting layer 24 made of undoped indium gallium nitride (In$_{0.2}$Ga$_{0.8}$N) having a thickness of about 2 nm, an n-type barrier layer 25 made of n-type aluminum gallium nitride (Al$_{0.3}$Ga$_{0.7}$N) doped with silicon having a thickness of about 0.1 μm, and an n-type contact layer 26 made of n-type gallium nitride doped with silicon having a thickness of about 0.5 μm are sequentially grown on the p-type barrier layer 23. Thus, a light-emitting diode element having a single quantum well structure in which the light emitting layer 24 is sandwiched by the p-type barrier layer 23 and the n-type barrier layer 25 is formed.

Figure 2E:
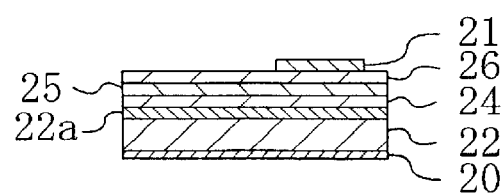

Next, as shown in FIG. 2E, after the epitaxial substrate in which all the layers up to the n-type contact layer 26 have been grown is taken out of the reaction chamber and cooled to room temperature, a negative electrode 21 made of a laminated film of titanium and aluminum having a thickness of about 1 μm is formed selectively on the n-type contact layer 26 by an evaporation method. Then, although not shown, a holding material made of an adhesive tape material, a glass material, a resist material or other materials that are hardly dissolved in hydrochloric acid (HCl) is attached, applied or plated onto the negative electrode 21 and the n-type contact layer 26 in order to facilitate the handling of the epitaxial layer after the mother substrate 11 is removed. Thereafter, the thermally decomposed layer 22a is removed with hydrochloric acid, so that the mother substrate 11 is separated from the p-type contact layer 22. Then, a positive electrode 20 made of a laminated film of nickel and gold having a thickness of about 1 μm is formed by an evaporation method on the surface of the p-type contact layer 22 to which the thermally decomposed layer 22a was attached. The order of the formation of the positive electrode 20 and the negative electrode 21 does not matter in this case as well. Thereafter, a light-emitting device can be obtained by dividing the epitaxial layer into about 300 μm square chips, using a dicer. In this embodiment, output light having a wavelength of 450 nm is obtained by applying a voltage across the positive electrode 20 and the negative electrode 21. The holding material is removed before or after the process for dividing the epitaxial layer into chips.

Thus, according to the second embodiment, the p-type contact layer 22 and the p-type barrier layer are formed on the mother substrate 11, and then the mother substrate 11 is irradiated with the laser light 80 from the surface opposite to the p-type contact layer 22, so that the thermally decomposed layer 22a obtained by thermally decomposing the p-type contact layer 22 is formed at the interface of the p-type contact layer 22 with the mother substrate 11. Therefore, the stress applied from the mother substrate 11 to the p-type contact layer 22 when the light-emitting layer 24, the n-type barrier layer 25 and the n-type contact layer 26 are grown on the p-type barrier layer 23 and then the epitaxial substrate is cooled back to room temperature, which is caused by the difference in the thermal expansion coefficient between the mother substrate 11 and the p-type contact layer 22, can be reduced by the thermally decomposed layer 22a. Consequently, the strain applied to the light-emitting layer 24 during cooling can be reduced, so that the piezoelectric effect, which causes the recombination probability between electrons and holes to be reduced, can be decreased, and therefore the light-emitting efficiency can be improved. Furthermore, defects such as cracks occurring in the epitaxial layer can be prevented.

In addition, unlike the first embodiment, since the thermal deposition layer 22a is formed in the p-type contact layer 22 by the laser light 80, the heat generated in the p-type contact layer 22 during irradiation of the laser light 80 activates the p-type acceptor in the p-type contact layer 22 and the p-type barrier layer 23 thereon. Therefore, the process for activating the acceptor by a heat treatment for activation or electron beam irradiation or the like can be eliminated.

Third Embodiment

Hereinafter, a third embodiment of the present invention will be described with reference to the accompanying drawings.

FIGS. 3A to 3E are cross-sectional views showing the process sequence in a method for producing a semiconductor laser device, which is a semiconductor device of a third embodiment of the present invention.

Figure 3A:
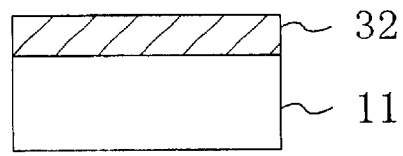
FIGS. 3A to 3E are cross-sectional views showing the process sequence in a method for producing a semiconductor device of a third embodiment of the present invention.

First, as shown in FIG. 3A, a mother substrate 11 made of sapphire having the C plane as its principal plane and having a thickness of about 300 μm is introduced into, for example, an MOVPE apparatus, and a buffer layer (not shown) made of gallium nitride (GaN) having a thickness of about 20 nm and an n-type contact layer 32 made of n-type gallium nitride doped with silicon having a thickness of about 5 μm are sequentially grown on the principal plane of the introduced mother substrate 11.

Figure 3B:
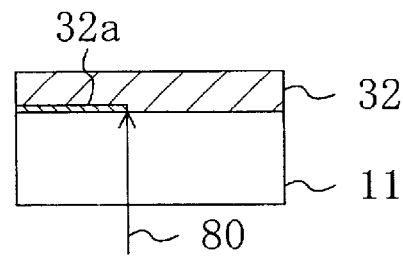
Figure 3C:
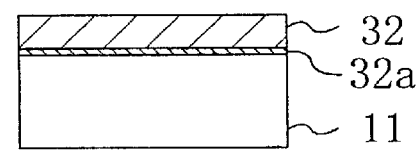

As shown in FIG. 3B, after the epitaxial substrate is taken out of the reaction chamber of the MOVPE apparatus, the mother substrate 11 is irradiated with laser light 80 from the surface opposite to the n-type contact layer 32, so that a thermally decomposed layer 32a obtained by thermally decomposing the n-type contact layer 32 is formed at the interface of the n-type contact layer 32 with the mother substrate 11. As the laser light 80, for example, the third harmonics of Nd:YAG laser light or KrF excimer laser light is used The irradiation energy at this time is about 0.3 J/cm$^2$, the interval between pulses is about 5 ns, and the spot diameter of the laser light 80 during irradiation is about 100 μm. The laser light 80 is absorbed in the n-type contact layer 32, and this absorption causes the n-type contact layer 32 to be thermally decomposed into metal gallium and nitrogen gas. Therefore, as shown in FIG. 3C, when the entire surface of the n-type contact layer 32 is scanned by the laser light 80, the mother substrate 11 and the n-type contact layer 32 are attached by the thermally decomposed layer 32a. In this embodiment, the value of the irradiation energy of the laser light 80 is set to about 0.1 J/cm$^2$ or more and about 20 J/cm$^2$ or less, so that the mother substrate 11 is not completely separated from the n-type contact layer 32.

Figure 3D:
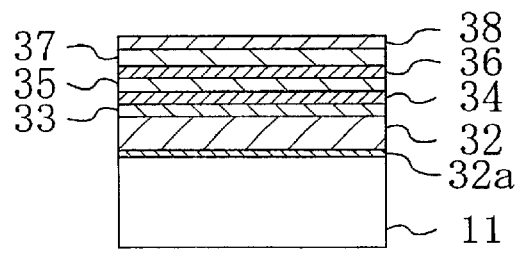

Next, as shown in FIG. 3D, the epitaxial substrate with the n-type contact layer 32 attached is introduced again to the reaction chamber of the MOVPE apparatus, so that n-type gallium nitride is further grown on the n-type contact layer 32 so as to increase the thickness of the n-type contact layer 32 to about 20 μm. Then, a first cladding layer 33 made of n-type aluminum gallium nitride (Al$_{0.15}$Ga$_{0.85}$N) doped with silicon having a thickness of about 1 μm, a first optical guide layer 34 made of undoped gallium nitride having a thickness of about 0.1 μm, a quantum well active layer 35, a second optical guide layer 36 made of undoped gallium nitride having a thickness of about 0.1 μm, a second cladding layer 37 made of p-type aluminum gallium nitride (Al$_{0.15}$Ga$_{0.85}$N) doped with magnesium having a thickness of about 1 μm, and a p-type contact layer 38 made of p-type gallium nitride doped with magnesium having a thickness of about 0.3 μm are sequentially grown on the n-type contact layer 32.

In this embodiment, although not shown, the quantum well active layer 35 has a multiple quantum well structure in which a well layer made of indium gallium nitride ($In_{0.15}Ga_{0.85}N$) having a thickness of about 3 nm, and a barrier layer made of indium gallium nitride ($In_{0.02}Ga_{0.98}N$) having a thickness of about 7 nm are formed repeatedly for 3 cycles. Thus, a semiconductor laser element having a multiple quantum well structure in which the quantum well active layer 35 is sandwiched by the n-type first cladding layer 33 and the p-type second cladding layer 37 is formed.

Figure 3E:
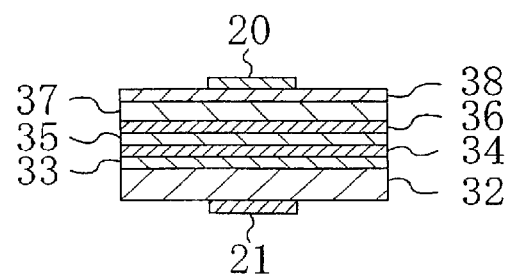

Next, as shown in FIG. 3E, after the epitaxial substrate in which all the layers up to the p-type contact layer 38 have been grown is taken out of the reaction chamber and cooled to room temperature, a positive electrode 20 made of a laminated film of nickel and gold having a thickness of about 1 μm is formed on the p-type contact layer 38 by an evaporation method. Furthermore, the positive electrode 20 is patterned in a stripe by dry etching or the like, so as to serve as a wave guide of the quantum well active layer 35. Then, although not shown, a holding material made of an adhesive tape material, a glass material, a resist material or other materials that are hardly dissolved in hydrochloric acid is attached (applied) onto the positive electrode 20 and the p-type contact layer 38 in order to facilitate the handling of the epitaxial layer after the mother substrate 11 is removed. Thereafter, the thermally decomposed layer 32a is removed with hydrochloric acid, so that the mother substrate 11 is separated from the n-type contact layer 32. Then, a negative electrode 21 made of a laminated film of titanium and aluminum having a thickness of about 1 μm is formed by an evaporation method on the surface of the n-type contact layer 32 to which the thermally decomposed layer 32a was attached. Furthermore, the negative electrode 21 is patterned so as to oppose the positive electrode 20. Herein as well, the order of the formation of the positive electrode 20 and the negative electrode 21 does not matter.

Then, for example, the n-type contact layer 32 of the epitaxial layer is scribed by a point scriber so that the (-1100) plane and the (1-100) plane of the orientations in the epitaxial layer (quantum well active layer 35) serve as the end faces of a resonator, and a weight is added along the scribe line and the epitaxial layer is cleaved. Thus, a desired laser chip can be obtained from the epitaxial layer. The light generated in the quantum well active layer 35 of the laser chip is reflected and resonated by the end face of the resonator and is released as laser light. Herein, the distance between the end faces of a resonator is about 500 μm, and the holding material for holding the epitaxial layer is removed before or after the process for dividing the epitaxial layer into chips.

In this specification, the minus sign "−" attached to Miller indices included in the orientation represents the reversal of the index following the minus sign for convenience.

The thus obtained laser chip was held on a heat sink with the positive electrode 20 at the upper surface (p-side up), and the electrodes 20 and 21 were wire-bonded and laser oscillation was performed. Then, it was confirmed that the laser light having an oscillation wavelength of 405 nm can be oscillated continuously at room temperature.

Thus, according to the third embodiment, a lower portion of the n-type contact layer 32 is formed on the mother substrate 11, and then the mother substrate 11 is irradiated with the laser light 80 from the surface opposite to the n-type contact layer 32. Thus, the thermally decomposed layer 32a obtained by thermally decomposing the n-type contact layer 32 is formed at the interface of the n-type contact layer 32 with the mother substrate 11. Therefore, the stress applied from the mother substrate 11 to the n-type contact layer 32 when the n-type contact layer 32 is grown again, the semiconductor layers including the quantum well active layer 35 are further grown thereon and then the epitaxial substrate is cooled back to room temperature, which is caused by the difference in the thermal expansion coefficient between the mother substrate 11 and the n-type contact layer 32, can be reduced reliably by the thermally decomposed layer 32a. Consequently, the strain applied to the quantum well active layer 35 during cooling can be reduced, so that the piezoelectric effect, which causes the recombination probability between electrons and holes to be reduced, can be decreased, and therefore the light-emitting efficiency can be improved. Furthermore, defects such as cracks occurring in the epitaxial layer can be prevented.

Furthermore, the mother substrate 11 made of sapphire, which is hardly subjected to processing, is removed and then cleavage is performed, so that the wafer can be divided into chips easily without cracks or fractures occurring, thus improving the yield.

Furthermore, since the mother substrate 11, which is an insulator, is removed, the negative electrode 21 can be formed so as to oppose the positive electrode 20 on the surface of the n-type contact layer 32 opposite to the quantum well active layer 35, so that the chip area can be reduced. As a result, a large number of laser elements can be obtained from one wafer.

Furthermore, since the mother substrate 11 having a small thermal conductivity and a thickness of several hundreds of μm is removed, the volume per element can be reduced, which facilitates achieving compactness. In addition, the heat release properties of the epitaxial layer are improved, so that the temperature characteristics as a semiconductor laser device can be improved, so that the life of the elements can be improved remarkably.

Fourth Embodiment

Hereinafter, a fourth embodiment of the present invention will be described with reference to the accompanying drawings.

FIGS. 4A to 4F are cross-sectional views showing the process sequence in a method for producing a semiconductor laser device, which is a semiconductor device of a fourth embodiment of the present invention.

Figure 4A:
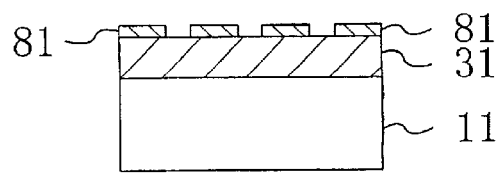
FIGS. 4A to 4F are cross-sectional views showing the process sequence in a method for producing a semiconductor device of a fourth embodiment of the present invention.

First, as shown in FIG. 4A, a mother substrate 11 made of sapphire having the C plane as its principal plane and having a thickness of about 300 μm is introduced into, for example, an MOVPE apparatus, and a buffer layer (not shown) made of gallium nitride (GaN) having a thickness of about 20 nm and an n-type underlying layer 31 made of n-type gallium nitride doped with silicon having a thickness of about 5 μm are sequentially grown on the principal plane of the introduced mother substrate 11. Then, the epitaxial substrate is taken out of the reaction chamber, and thereafter a dielectric film made of silicon oxide ($SiO_2$) having a thickness of about 100 nm is deposited on the entire surface of the n-type underlying layer 31 by sputtering or CVD. Subsequently, a mask film 81 having a 5 μm stripe shape for both the width and the gap in which the stripe is extending in the <11–20> direction of the zone axis of the gallium nitride constituting the n-type underlying layer 31 is formed from the deposited dielectric film by lithography and wet etching using hydrofluoric acid (HF) as an etchant.

Figure 4B:
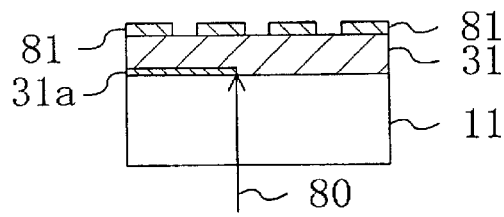
Figure 4C:
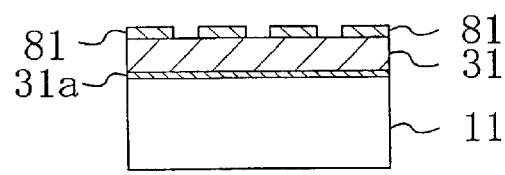

Then, as shown in FIG. 4B, the mother substrate 11 is irradiated with laser light 80 from the surface opposite to the n-type underlying layer 31, so that a thermally decomposed layer 31a obtained by thermally decomposing the n-type underlying layer 31 is formed at the interface of the n-type underlying layer 31 with the mother substrate 11. As the laser light 80, for example, the third harmonics of Nd:YAG laser light or KrF excimer laser light is used The irradiation energy at this time is about 0.3 J/cm$^2$, the interval between pulses is about 5 ns, and the spot diameter of the laser light 80 during irradiation is about 100 μm. The laser light 80 is absorbed in the n-type underlying layer 31, and this absorption causes the n-type underlying layer 31 to be thermally decomposed into metal gallium and nitrogen gas. Therefore, as shown in FIG. 4C, when the entire surface of the n-type underlying layer 31 is scanned by the laser light 80, the mother substrate 11 and the n-type underlying layer 31 are attached by the thermally decomposed layer 31a. In this embodiment, the value of the irradiation energy of the laser light 80 is set to about 0.1 J/cm$^2$ or more and about 20 J/cm$^2$ or less, so that the mother substrate 11 is not completely separated from the n-type underlying layer 31.

Figure 4D:
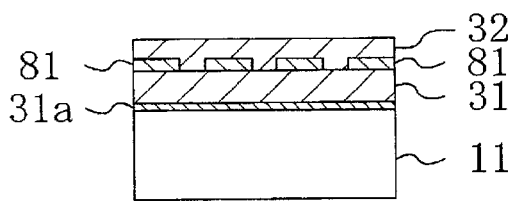

Next, as shown in FIG. 4D, the epitaxial substrate with the n-type underlying layer 31 attached is introduced again to the reaction chamber of the MOVPE apparatus, so that n-type gallium nitride doped with silicon is grown on the n-type underlying layer 31 using the mask film 81 as a mask for selective growth to form an n-type contact layer 32 having a thickness of about 15 μm. In this case, the gallium nitride constituting the n-type contact layer 32 has a different crystal structure than that of the silicon oxide constituting the mask film 81, so that crystal grown is not caused on the mask film 81 and crystal grown starts in the exposed portions from the openings of the mask film 81 in the n-type underlying layer 31. When the crystals are further grown, the n-type contact layer 32 grown from the openings of the mask film 81 start to be grown in the traverse direction (direction parallel to the substrate surface) in the portion above the mask film 81, until the portion of the n-type contact layer 32 grown from the openings of the mask film 81 covers the mask film 81. Herein, a dislocation generated by a lattice mismatch with respect to the mother substrate 11 is present in a direction substantially perpendicular to the substrate surface in the portion of the n-type contact layer 32 grown above the openings of the mask film 81. On the other hand, in the portion of the n-type contact layer 32 above the mask film 81, the dislocation (defect) present in the n-type contact layer 32 is prevented from propagating by the mask film 81, so that the dislocation density is small. For example, the dislocation density of the n-type contact layer 32 of the fourth embodiment is one or two orders smaller than that of the n-type contact layer 32 of the third embodiment.

Figure 4E:
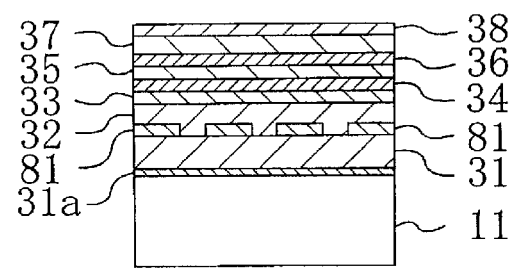

Furthermore, as shown in FIG. 4E, a first cladding layer 33 made of n-type aluminum gallium nitride ($Al_{0.15}Ga_{0.85}N$) doped with silicon having a thickness of about 1 μm, a first optical guide layer 34 made of undoped gallium nitride having a thickness of about 0.1 μm, a quantum well active layer 35, a second optical guide layer 36 made of undoped gallium nitride having a thickness of about 0.1 μm, a second cladding layer 37 made of p-type aluminum gallium nitride ($Al_{0.1}Ga_{0.9}N$) doped with magnesium having a thickness of about 1 μm, and a p-type contact layer 38 made of p-type gallium nitride doped with magnesium having a thickness of about 0.3 μm are sequentially grown on the n-type contact layer 32. In this case, the quantum well active layer 35 has the same multiple quantum well structure as in the third embodiment.

Figure 4F:
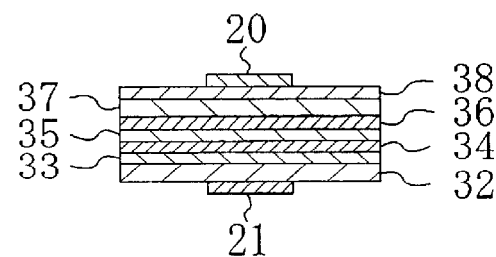

Next, as shown in FIG. 4F, after the epitaxial substrate in which all the layers up to the p-type contact layer 38 have been grown is taken out of the reaction chamber and cooled to room temperature, a positive electrode 20 made of a laminated film of nickel and gold having a thickness of about 1 μm is formed on the p-type contact layer 38 by an evaporation method. Furthermore, the positive electrode 20 is patterned in a stripe by dry etching or the like, so as to serve as a wave guide of the quantum well active layer 35. Then, although not shown, a holding material made of an adhesive tape material, a glass material, a resist material or other materials that are hardly dissolved in hydrochloric acid is attached, applied or plated onto the positive electrode 20 and the p-type contact layer 38 in order to facilitate the handling of the epitaxial layer after the mother substrate 11 is removed. Thereafter, the thermally decomposed layer 31a is removed with hydrochloric acid, so that the mother substrate 11 is separated from the n-type underlying layer 31. Subsequently, the n-type underlying layer 31 and the mask film 81 are removed by polishing such as chemical mechanical polishing (CMP). Then, a negative electrode 21 made of a laminated film of titanium and aluminum having a thickness of about 1 μm is formed by an evaporation method on the surface of the n-type contact layer 32 opposite to the positive electrode 20. Furthermore, the negative electrode 21 is patterned so as to oppose the positive electrode 20. Herein as well, the order of the formation of the positive electrode 20 and the negative electrode 21 does not matter.

Then, for example, the n-type contact layer 32 of the epitaxial layer is scribed by a point scriber so that the (-1100) plane and the (1-100) plane of the orientations in the epitaxial layer serve (quantum well active layer 35) as the end faces of a resonator, and a weight is added along the scribe line and the epitaxial layer is cleaved. Thus, a desired laser chip can be obtained from the epitaxial layer. Herein, the distance between the end faces of a resonator is about 500 μm, and the holding material for holding the epitaxial layer is removed before or after the process for dividing the epitaxial layer into chips.

The thus obtained laser chip was held on a heat sink with the p-side up, and the electrodes 20 and 21 were wire-bonded and laser oscillation was performed. Then, it was confirmed that the laser light having an oscillation wavelength of 405 nm can be oscillated continuously at room temperature.

Thus, according to the fourth embodiment, the n-type underlying layer 31 that is a layer underlying the n-type contact layer 32 is formed on the mother substrate 11, and then the mother substrate 11 is irradiated with the laser light 80 from the surface opposite to the n-type underlying layer 31, so that the thermally decomposed layer 31a obtained by thermally decomposing the n-type underlying layer 31 is formed at the interface of the n-type underlying layer 31 with the mother substrate 11. Therefore, the stress applied from the mother substrate 11 to the n-type underlying layer 31 when the n-type contact layer 32 is grown on the n-type underlying layer 31 and further the semiconductor layers including the quantum well active layer 35 are grown and then the epitaxial substrate is cooled back to room temperature, which is caused by the difference in the thermal expansion coefficient between the mother substrate 11 and the n-type underlying layer 31, can be reduced by the thermally decomposed layer 31a.

In addition, the n-type contact layer 32 of the fourth embodiment is selectively grown from the n-type underlying layer 31 exposed from the openings of the mask film 81 made of a material that substantially prevents gallium nitride from being grown (selective growth in the traverse direction). Therefore, the dislocation density is significantly reduced. As a result, the crystallinity of the epitaxial layer including the quantum well active layer 35 is improved, so that the operational characteristics of the semiconductor laser device is significantly improved.

The shape of the mask film 81 is a stripe, but is not limited thereto, and the same effect can be obtained with dotted shapes or lattice shapes.

Fifth Embodiment

Hereinafter, a fifth embodiment of the present invention will be described with reference to the accompanying drawings.

FIGS. 5A to 5F are cross-sectional views showing the process sequence in a method for producing a semiconductor laser device, which is a semiconductor device of a fifth embodiment of the present invention.

Figure 5A:
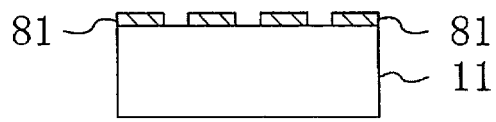
FIGS. 5A to 5F are cross-sectional views showing the process sequence in a method for producing a semiconductor device of a fifth embodiment of the present invention.

First, as shown in FIG. 5A, a dielectric film made of silicon oxide having a thickness of about 100 nm is deposited on a mother substrate 11 made of sapphire having the C plane as its principal plane and having a thickness of about 300 $\mu$m by, for example, sputtering or CVD. Subsequently, a mask film 81 having a 5 $\mu$m stripe shape for both the width and the gap in which the stripe is extending in the <1–100> direction of the zone axis of the sapphire constituting the mother substrate 11 is formed from the deposited dielectric film by lithography and wet etching using hydrofluoric acid as an etchant.

Figure 5B:
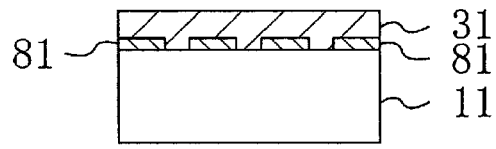

Then, as shown in FIG. 5B, the mother substrate 11 provided with the mask film 81 is introduced into the reaction chamber of the MOVPE apparatus, and n-type gallium nitride is grown using the mask film 81 as a mask for selective growth, so that a buffer layer (not shown) having a thickness of about 30 nm is formed. Then, n-type gallium nitride doped with silicon is grown on the buffer layer so that the n-type underlying layer 31 having a thickness of about 5 $\mu$m is formed. Herein, the n-type underlying layer 31 is configured so as to include the buffer layer. In this case, the gallium nitride constituting the n-type underlying layer 31 is not crystal-grown on the mask film 81 and starts to be grown in the exposed portions from the openings of the mask film 81 in the n-type underlying layer 31. When the crystals are further grown, the n-type underlying layer 31 grown from the openings of the mask film 81 start to be grown in the traverse direction (direction parallel to the substrate surface) in the portion above the mask film 81, until the portion of the n-type underlying layer 31 grown from the openings of the mask film 81 covers the mask film 81. Herein, a dislocation generated by a lattice mismatch with respect to the mother substrate 11 is present in a direction substantially perpendicular to the substrate surface in the portion of the n-type underlying layer 31 grown above the openings of the mask film 81. On the other hand, in the portion of the n-type underlying layer 31 above the mask film 81, the dislocation (defect) present in the n-type underlying layer 31 is prevented from propagating by the mask film 81, so that the dislocation is low.

Figure 5C:
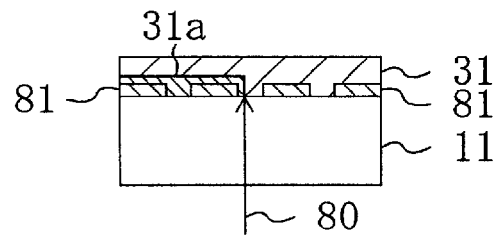
Figure 5D:
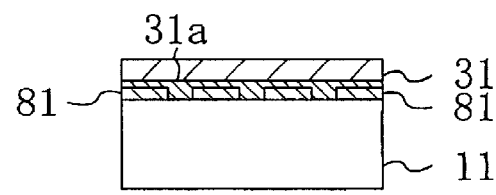

Then, as shown in FIG. 5C, after the epitaxial substrate is taken out of the reaction chamber of the MOVPE apparatus, the mother substrate 11 is irradiated with laser light 80 from the surface opposite to the n-type underlying layer 31, so that a thermally decomposed layer 31a obtained by thermally decomposing the n-type underlying layer 31 is formed at the interface of the n-type underlying layer 31 with the mother substrate 11 and in the vicinity of the mask film 81. As the laser light 80, for example, the third harmonics of Nd:YAG laser light or KrF excimer laser light is used The irradiation energy at this time is about 0.3 J/cm$^2$, the interval between pulses is about 5 ns, and the spot diameter of the laser light 80 during irradiation is about 100 $\mu$m. The laser light 80 is not absorbed in the silicon oxide film (mask film 81) but is absorbed in the n-type underlying layer 31 since silicon oxide has a wavelength of 190 nm at the absorption edge. This absorption causes the n-type underlying layer 31 to be thermally decomposed into metal gallium and nitrogen gas. Therefore, as shown in FIG. 5D, when the entire surface of the n-type underlying layer 31 is scanned by the laser light 80, the mother substrate 11 and the n-type underlying layer 31 are attached by the thermally decomposed layer 31a. In this case, the value of the irradiation energy of the laser light 80 is set to about 0.1 J/cm$^2$ or more and about 20 J/cm$^2$ or less, so that the mother substrate 11 is not completely separated from the n-type underlying layer 31.

Figure 5E:
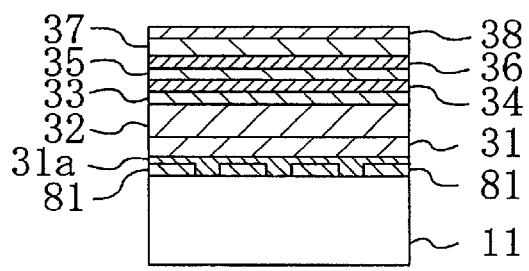

Next, as shown in FIG. 5E, the epitaxial substrate with the n-type underlying layer 31 attached is introduced again to the reaction chamber of the MOVPE apparatus. Subsequently, an n-type contact layer 32 made of n-type gallium nitride doped with silicon having a thickness of about 15 $\mu$m, a first cladding layer 33 made of n-type aluminum gallium nitride ($Al_{0.15}Ga_{0.85}N$) doped with silicon having a thickness of about 1 $\mu$m, a first optical guide layer 34 made of undoped gallium nitride having a thickness of about 0.1 $\mu$m, a quantum well active layer 35, a second optical guide layer 36 made of undoped gallium nitride having a thickness of about 0.1 $\mu$m, a second cladding layer 37 made of p-type aluminum gallium nitride ($Al_{0.1}Ga_{0.9}N$) doped with magnesium having a thickness of about 1 $\mu$m, and a p-type contact layer 38 made of p-type gallium nitride doped with magnesium having a thickness of about 0.3 $\mu$m are sequentially grown on the n-type underlying layer 31. In this case, the quantum well active layer 35 has the same multiple quantum well structure as in the third embodiment.

Figure 5F:
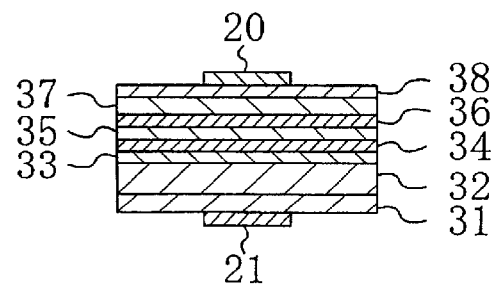

Next, as shown in FIG. 5F, after the epitaxial substrate in which all the layers up to the p-type contact layer 38 have been grown is taken out of the reaction chamber and cooled to room temperature, a positive electrode 20 made of a laminated film of nickel and gold having a thickness of about 1 $\mu$m is formed on the p-type contact layer 38 by an evaporation method. Furthermore, the positive electrode 20 is patterned in a stripe by dry etching or the like, so as to serve as a wave guide of the quantum well active layer 35. Then, although not shown, a holding material made of an adhesive tape material, a glass material, a resist material or other materials that are hardly dissolved in hydrochloric acid is attached, applied or plated onto the positive electrode 20 and the p-type contact layer 38 in order to facilitate the handling of the epitaxial layer after the mother substrate 11 is removed. Thereafter, the thermally decomposed layer 31a is removed with hydrochloric acid, so that the mother substrate 11 is separated from the n-type underlying layer 31, and then, the n-type underlying layer 31 and the mask film 81 are polished and removed by a CMP method. Then, a negative electrode 21 made of a laminated film of titanium and aluminum having a thickness of about 1 $\mu$m is formed by an evaporation method on the surface of the n-type underlying layer 31 to which the thermal decomposition film 31a was attached. Furthermore, the negative electrode 21 is patterned so as to oppose the positive electrode 20. Herein as well, the order of the formation of the positive electrode 20 and the negative electrode 21 does not matter. Then, for example, the n-type contact layer 32 of the epitaxial layer is scribed by a point scriber so that the (-1100) plane and the (1-100) plane of the orientations in the epitaxial layer (quantum well active layer 35) serve as the end faces of a resonator, and a weight is added along the scribe line and the epitaxial layer is cleaved. Thus, a desired laser chip can be obtained from the epitaxial layer. Herein, the distance between the end faces of a resonator is about 500 $\mu$m, and the holding material for holding the epitaxial layer is removed before or after the process for dividing the epitaxial layer into chips.

The thus obtained laser chip was held on a heat sink with the p-side up, and the electrodes 20 and 21 were wire-bonded and laser oscillation was performed. Then, it was confirmed that the laser light having an oscillation wavelength of 405 nm can be oscillated continuously at room temperature.

Thus, according to the fifth embodiment, after the mask film 81 for selective growth is formed on the mother substrate 11, the n-type underlying layer 31 that is a layer underlying the n-type contact layer 32 is selectively grown. Thereafter, the mother substrate 11 is irradiated with the laser light 80 from the surface opposite to the n-type underlying layer 31, so that the thermally decomposed layer 31a obtained by thermally decomposing the n-type underlying layer 31 is formed at the interface of the n-type underlying layer 31 with the mother substrate 11. Therefore, the stress applied from the mother substrate 11 to the n-type underlying layer 31 when the n-type contact layer 32 is grown on the n-type underlying layer 31 and further the semiconductor layers including the quantum well active layer 35 are grown and then the epitaxial substrate is cooled back to room temperature, which is caused by the difference in the thermal expansion coefficient between the mother substrate 11 and the n-type underlying layer 31, can be reduced by the thermally decomposed layer 31a.

In addition, the n-type underlying layer 31 of the fifth embodiment is selectively grown from the mother substrate 11 exposed from the openings of the mask film 81 made of a material that substantially prevents gallium nitride from being grown (selective growth in the traverse direction). Therefore, the dislocation density is significantly reduced. As a result, the crystallinity of the epitaxial layer including the quantum well active layer 35 is improved, so that the operational characteristics of the semiconductor laser device is significantly improved.

The shape of the mask film 81 is a stripe, but is not limited thereto, and the same effect can be obtained with dotted shapes or lattice shapes.

Sixth Embodiment

Hereinafter, a sixth embodiment of the present invention will be described with reference to the accompanying drawings.

FIGS. 6A to 6E are cross-sectional views showing the process sequence in a method for producing a semiconductor laser device, which is a semiconductor device of a sixth embodiment of the present invention.

Figure 6A:
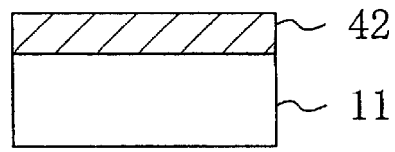
FIGS. 6A to 6E are cross-sectional views showing the process sequence in a method for producing a semiconductor device of a sixth embodiment of the present invention.

First, as shown in FIG. 6A, a mother substrate 11 made of sapphire having the C plane as its principal plane and having a thickness of about 300 $\mu$m is introduced into an MOVPE apparatus, so that a buffer layer (not shown) made of aluminum gallium nitride ($Al_{0.15}Ga_{0.85}N$) having a thickness of about 20 nm and an n-type contact layer 42 made of aluminum gallium nitride ($Al_{0.15}Ga_{0.85}N$) doped with silicon having a thickness of about 1 $\mu$m are sequentially grown on the principal plane of the introduced mother substrate 11. The n-type contact layer 42 is configured to as to include the buffer layer.

Figure 6B:
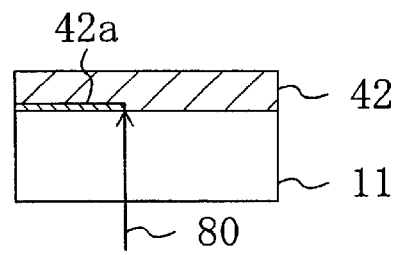
Figure 6C:
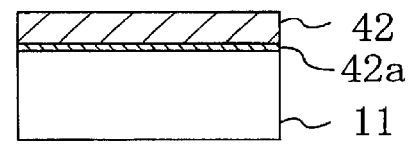

As shown in FIG. 6B, after the epitaxial substrate is taken out of the reaction chamber of the MOVPE apparatus, the mother substrate 11 is irradiated with laser light 80 from the surface opposite to the n-type contact layer 42, so that a thermally decomposed layer 42a obtained by thermally decomposing the n-type contact layer 42 is formed at the interface of the n-type contact layer 42 with the mother substrate 11. As the laser light 80, for example, KrF excimer laser light of a wavelength of 248 nm is used. The irradiation energy at this time is about 0.3 J/cm$^2$, the interval between pulses is about 5 ns, and the spot diameter of the laser light 80 during irradiation is about 100 $\mu$m. Sapphire is transparent with respect to the laser light 80, and therefore the light cannot be absorbed by the mother substrate 11. On the other hand, the wavelength of the absorption edge in the forbidden band of the aluminum gallium nitride ($Al_{0.15}Ga_{0.85}N$) is about 330 nm to 340 nm, so that the wavelength of the laser light 80 is shorter and therefore the laser light 80 is absorbed in the n-type contact layer 42. This absorption causes the n-type contact layer 42 to be thermally decomposed into gallium, aluminum and nitrogen gas. Wherein, the thermally decomposed layer 42a is made of an alloy of gallium and aluminum of which melting point is lower than that of pure gallium. Therefore, in this case, the value of the irradiation energy of the laser light 80 is set to about 0.1 J/cm$^2$ or more and about 20 J/cm$^2$ or less, so that as described above, the mother substrate 11 and the n-type contact layer 42 are attached by the thermally decomposed layer 42a in a melted state if the temperature is equal to or more than the melting point of the alloy. Therefore, as shown in FIG. 6C, when the entire surface of the n-type contact layer 42 is scanned by the laser light 80, the mother substrate 11 and the n-type contact layer 42 are attached by the thermally decomposed layer 42a.

Figure 6D:
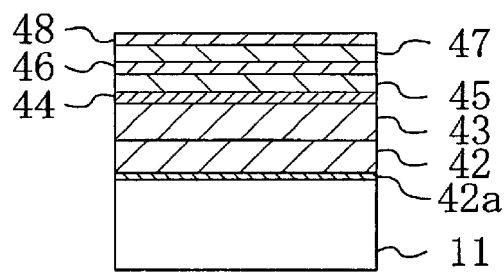

Next, as shown in FIG. 6D, the epitaxial substrate with the n-type contact layer 42 attached is introduced again to the reaction chamber of the MOVPE apparatus. Subsequently, a first cladding layer 43 made of n-type aluminum gallium nitride ($Al_{0.15}Ga_{0.85}N$) doped with silicon having a thickness of about 20 $\mu$m, a first optical guide layer 44 made of undoped gallium nitride having a thickness of about 0.1 $\mu$m, a quantum well active layer 45, a second optical guide layer 46 made of undoped gallium nitride having a thickness of about 0.1 $\mu$m, a second cladding layer 47 made of p-type aluminum gallium nitride ($Al_{0.15}Ga_{0.85}N$) doped with magnesium having a thickness of about 1.5 $\mu$m, and a p-type contact layer 48 made of p-type gallium nitride doped with magnesium having a thickness of about 0.3 $\mu$m are sequentially grown on the n-type contact layer 42. In this embodiment as well as in the third embodiment, the quantum well active layer 45 has a structure in which a well layer made of indium gallium nitride ($In_{0.15}Ga_{0.85}N$) having a thickness of about 3 nm, and a barrier layer made of indium gallium nitride ($In_{0.02}Ga_{0.98}N$) having a thickness of about 7 nm are formed repeatedly for 3 cycles.

Figure 6E:
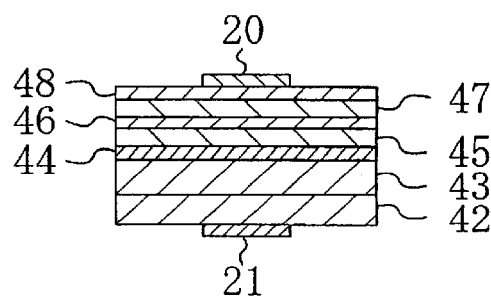

Next, as shown in FIG. 6E, after the epitaxial substrate in which all the layers up to the p-type contact layer 48 have been grown is taken out of the reaction chamber and cooled to room temperature, a positive electrode 20 made of a laminated film of nickel and gold having a thickness of about 1 $\mu$m is formed on the p-type contact layer 48 by an evaporation method. Furthermore, the positive electrode 20 is patterned in a stripe by dry etching or the like, so as to serve as a wave guide of the quantum well active layer 45. Then, although not shown, a holding material made of an adhesive tape material, a glass material, a resist material or other materials that are hardly dissolved in hydrochloric acid is attached, applied or plated onto the positive electrode 20 and the p-type contact layer 48 in order to facilitate the handling of the epitaxial layer after the mother substrate 11 is removed. Thereafter, the thermally decomposed layer 42a is removed with hydrochloric acid, so that the mother substrate 11 is separated from the n-type contact layer 42. Then, a negative electrode 21 made of a laminated film of titanium and aluminum having a thickness of about 1 μm is formed by an evaporation method on the surface of the n-type contact layer 42 to which the thermally decomposed layer 42a was attached. Furthermore, the negative electrode 21 is patterned so as to oppose the positive electrode 20. Herein as well, the order of the formation of the positive electrode 20 and the negative electrode 21 does not matter.

Then, for example, the n-type contact layer 32 of the epitaxial layer is scribed by a point scriber so that the (-1100) plane and the (1-100) plane of the orientations in the epitaxial layer serve (quantum well active layer 45) as the end faces of a resonator, and a weight is added along the scribe line and the epitaxial layer is cleaved. Thus, a desired laser chip can be obtained from the epitaxial layer. The light generated in the quantum well active layer 45 of the laser chip is reflected and resonated by the end face of the resonator and is released as laser light. Herein, the distance between the end faces of a resonator is about 500 μm, and the holding material for holding the epitaxial layer is removed before or after the process for dividing the epitaxial layer into chips.

As described above, in the sixth embodiment, the first semiconductor layer (n-type contact layer 42) is grown on the mother substrate 11, and then the first semiconductor layer is irradiated with the laser light 80 that can thermally decompose the first semiconductor layer from the side of mother substrate 11. Thus, the thermally decomposed layer 42a for attaching the interfaces of the mother substrate 11 and the first semiconductor layer while breaking the joining of the mother substrate 11 and the first semiconductor layer is formed. Thus, in the cooling process after the growth of the epitaxial layer shown in FIG. 6D, the stress caused by the difference in the thermal expansion coefficient between the mother substrate 11 and the first semiconductor layer can be reduced.

In general, when an aluminum gallium nitride (AlGaN) layer is grown on a gallium nitride (GaN) layer, cracks are likely to occur because of the lattice mismatch between the gallium nitride crystals and the aluminum gallium nitride crystals, so that the thickness cannot be increased. In addition, when the composition of the aluminum is increased to increase the forbidden band (band gap) of the semiconductor layer made of aluminum gallium nitride, the mismatch is further increased, and therefore the critical film thickness as crystal is reduced.

However, according to the sixth embodiment, the n-type contact layer 42 made of aluminum gallium nitride is grown to a thickness of not more than the critical film thickness, and then the n-type contact layer 42 is irradiated with the laser light 80, so that the stress applied from the mother substrate 11 can be reduced. Therefore, there is no possibility that cracks occurs in the n-type contact layer 42. Furthermore, after the irradiation of the laser light 80, the thermally decomposed layer 42a produced by thermal decomposition allows the n-type contact layer 42 to be in the state in which a stress applied from the mother substrate 11 is reduced, so that even if the first cladding layer 43 made of n-type aluminum gallium is grown to a comparatively large thickness on the n-type contact layer 42, there is no possibility that cracks occur in the first cladding layer 43.

Furthermore, even if the composition of the aluminum of the n-type contact layer 42 is further increased, no cracks occur in the n-type contact layer 42 and the first cladding layer 43, as long as the n-type contact layer 42 is irradiated with the laser light 80 after being grown to a thickness of not more than the critical film thickness. Therefore, it is possible to form the first cladding layer 43 having a large composition of aluminum and a large thickness, so that the ability of confining generated light and carriers of the quantum well active layer 45 can be improved.

In order to confine sufficiently generated light in the quantum well active layer 45, it is preferable that the composition of aluminum of the first cladding layer 43 is 0.05 or more, and that the thickness thereof including the n-type contact layer 42 is 0.5 μm or more.

In addition, gallium nitride may be used for the buffer layer in lieu to aluminum gallium nitride.

Seventh Embodiment

Hereinafter, a seventh embodiment of the present invention will be described with reference to the accompanying drawings.

FIGS. 7A to 7E are cross-sectional views showing the process sequence in a method for producing a surface-light-emitting laser device, which is a semiconductor device of a seventh embodiment of the present invention.

Figure 7A:
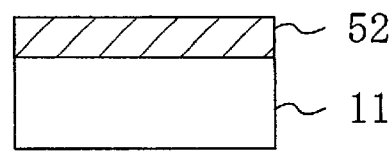
FIGS. 7A to 7E are cross-sectional views showing the process sequence in a method for producing a semiconductor device of a seventh embodiment of the present invention.

First, as shown in FIG. 7A, a mother substrate 11 made of sapphire having the C plane as its principal plane and having a thickness of about 300 μm is introduced into, for example an MOVPE apparatus, and a buffer layer (not shown) made of gallium nitride having a thickness of about 20 nm and an n-type contact layer 52 made of n-type gallium nitride doped with silicon having a thickness of about 5 μm are sequentially grown on the principal plane of the introduced mother substrate 11.

Figure 7B:
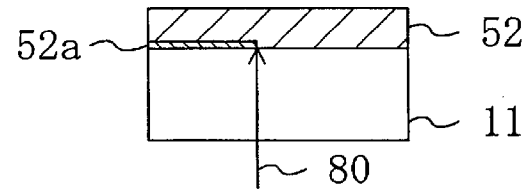
Figure 7C:
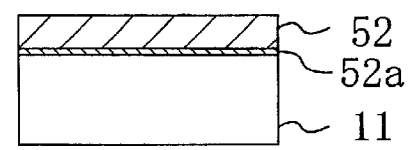

As shown in FIG. 7B, after the epitaxial substrate is taken out of the reaction chamber of the MOVPE apparatus, the mother substrate 11 is irradiated with laser light 80 from the surface opposite to the n-type contact layer 52, so that a thermally decomposed layer 52a obtained by thermally decomposing the n-type contact layer 52 is formed at the interface of the n-type contact layer 52 with the mother substrate 11. As the laser light 80, for example, the third harmonics of Nd:YAG laser light or KrF excimer laser light is used. The irradiation energy at this time is about 0.3 J/cm$^2$, the interval between pulses is about 5 ns, and the spot diameter of the laser light 80 during irradiation is about 100 μm. The laser light 80 is absorbed in the n-type contact layer 52, and this absorption causes the n-type contact layer 52 to be thermally decomposed into metal gallium and nitrogen gas. Therefore, as shown in FIG. 7C, when the entire surface of the n-type contact layer 52 is scanned by the laser light 80, the mother substrate 11 and the n-type contact layer 52 are attached by the thermally decomposed layer 52a. In this embodiment, the value of the irradiation energy of the laser light 80 is set to about 0.1 J/cm$^2$ or more and about 20 J/cm$^2$ or less, so that the mother substrate 11 is not completely separated from the n-type contact layer 52.

Figure 7D:
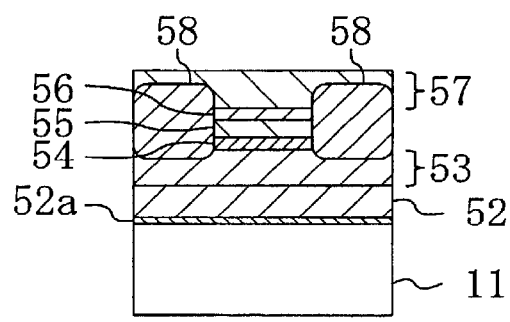

Next, as shown in FIG. 7D, the epitaxial substrate with the n-type contact layer 52 attached is introduced again to the reaction chamber of the MOVPE apparatus, so that n-type gallium nitride is further grown on the n-type contact layer 52 so as to increase the thickness of the n-type contact layer 52 to about 20 μm. Then, a first semiconductor layer (not shown) made of n-type gallium nitride (GaN) doped with silicon, and a second semiconductor layer (not shown) made of n-type aluminum gallium nitride ($Al_{0.34}Ga_{0.66}N$) doped with silicon are grown alternately for 35 cycles so as to form a multilayered film on the n-type contact layer 52, and thus an n-type reflecting mirror 53 is formed. In this embodiment, in the n-type reflecting mirror 53, the first semiconductor layers and the second semiconductor layers are laminated such that the thickness of one first semiconductor layer is about 43 nm, the thickness of one second semiconductor layer is about 44 nm, and the thicknesses satisfy $\lambda/(4\,n)$, where $\lambda$ is an emission wavelength in the active layer, and n is the refractive index of the first semiconductor layer or the second semiconductor layer. Thus, the n-type reflecting mirror 53 constitutes a Bragg reflector having a high reflectance.

Then, a first spacer layer 54 made of gallium nitride, an active layer 55, and second spacer layer 56 made of gallium nitride are sequentially grown on the n-type reflecting mirror 53. In this manner, the active layer 55 is sandwiched by the first spacer layer 54 and the second spacer layer 56 in a direction perpendicular to the substrate surface so that a resonator structure is formed. Although not shown, the active layer 55 is formed by repeating 26 cycles of forming a well layer made of $In_{0.10}Ga_{0.90}N$ having a thickness of about 3 nm, and a barrier layer made of $In_{0.01}Ga_{0.99}N$ having a thickness of about 5 nm.

Then, a first semiconductor layer (not shown) made of p-type gallium nitride (GaN) doped with magnesium, and a second semiconductor layer (not shown) made of p-type aluminum gallium nitride ($Al_{0.34}Ga_{0.66}N$) doped with magnesium are grown alternately for 30 cycles so as to form a multilayered film on the second spacer layer 56, and thus a p-type reflecting mirror 57 is formed. In this embodiment, in the p-type reflecting mirror 57, the thickness of one first semiconductor layer is about 43 nm, and the thickness of one second semiconductor layer is about 44 nm.

Then, the epitaxial substrate in which all the layers up to the p-type reflecting mirror 57 have been grown is taken out of the reaction chamber and cooled to room temperature. Thereafter, the upper surface of the p-type reflecting mirror 57 is irradiated with protons so that an insulating region 58 for narrowing current is formed in an area from the n-type reflecting mirror 53 through the p-type reflecting mirror 57 in the epitaxial layer.

Figure 7E:
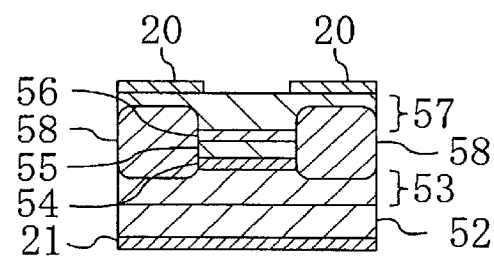

Next, as shown in FIG. 7E, a positive electrode 20 made of a laminated film of nickel and gold having a thickness of about 1 $\mu$m is formed on the p-type reflecting mirror 57 by an evaporation method. Furthermore, the positive electrode 20 is patterned in a stripe by dry etching or the like so that openings are formed in the area above the active layer 55 in the p-type reflecting mirror 57. Then, although not shown, a holding material made of an adhesive tape material, a glass material, a resist material or other materials that are hardly dissolved in hydrochloric acid is attached, applied or plated onto the positive electrode 20 and the p-type reflecting mirror 57 in order to facilitate the handling of the epitaxial layer after the mother substrate 11 is removed. Thereafter, the thermally decomposed layer 52a is removed with hydrochloric acid, so that the mother substrate 11 is separated from the n-type contact layer 52. Then, a negative electrode 21 made of a laminated film of titanium and aluminum having a thickness of about 1 $\mu$m is formed on the surface of the n-type contact layer 52 to which the thermally decomposed layer 52a was attached. Herein as well, the order of the formation of the positive electrode 20 and the negative electrode 21 does not matter.

Then, the epitaxial layer is divided into chips, using a dicer, and thus a surface-light-emitting laser device can be obtained. The holding material is removed before or after the process for dividing the epitaxial layer in the form of a wafer into chips.

The thus obtained laser chip was held on a heat sink with the positive electrode 20 on the upper side (face-up), and the electrodes 20 and 21 were wire-bonded and laser oscillation was performed. Then, it was confirmed that the current flowing in the laser chip was narrowed by the insulating region 58 and concentrated in the active layer 55, and thus the light generated in the active layer 55 resonates between the n-type reflecting mirror 53 and the p-type reflecting mirror 57 for laser oscillation, and laser light having an oscillation wavelength of 405 nm can be oscillated continuously at room temperature.

As described above, also in the surface-light emitting laser device of the seventh embodiment, the first semiconductor layer (n-type contact layer 52) is grown on the mother substrate 11, and then the first semiconductor layer is irradiated with the laser light 80 that can thermally decompose the first semiconductor layer from the side of mother substrate 11. Thus, the thermally decomposed layer 52a for attaching the interfaces of the mother substrate 11 and the first semiconductor layer while breaking the joining of the mother substrate 11 and the first semiconductor layer is formed. Thus, in the cooling process after the growth of the epitaxial layer shown in FIG. 7D, the stress caused by the difference in the thermal expansion coefficient between the mother substrate 11 and the first semiconductor layer can be reduced.

For the reflecting mirrors 53 and 57, the first semiconductor layer made of gallium nitride and the second semiconductor layer made of aluminum gallium nitride are formed alternately such that the thickness of each of the layers is $\lambda/(4n)$, that is, a thickness of one fourth of an effective wavelength of light propagating in the semiconductor layer. However, the present invention is not limited thereto, and the layers can be formed alternately such that the thickness is $3\lambda/(4n)$, that is, three fourths of an effective wavelength.

Moreover, each of the reflecting mirrors 53, 37 is not limited to the semiconductor but may be formed of a dielectric having a multi-layered structure composed of, for example, silicon oxide ($SiO_2$) and zirconium oxide ($ZrO_2$).

In addition, the insulting region 58 for narrowing current is formed by ion implantation in this case. However, it is not limited thereto but may be formed by selective oxidation.

Eighth Embodiment

Hereinafter, an eighth embodiment of the present invention will be described with reference to the accompanying drawings.

FIGS. 8A to 8E are cross-sectional views showing the process sequence in a method for producing a HFET, which is a semiconductor device of an eighth embodiment of the present invention.

Figure 8A:
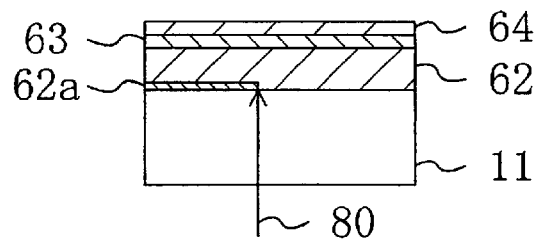
FIGS. 8A to 8E are cross-sectional views showing the process sequence in a method for producing a semiconductor device of an eighth embodiment of the present invention.
Figure 8B:
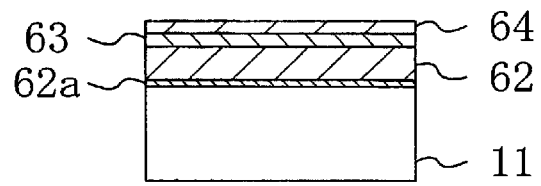

First, as shown in FIG. 8A, a mother substrate 11 made of sapphire having the C plane as its principal plane and having a thickness of about 300 $\mu$m is introduced into an MOVPE apparatus, so that a buffer layer (not shown) made of gallium nitride having a thickness of about 20 nm, a semiconductor layer (barrier layer) 62 made of aluminum gallium nitride ($Al_{0.15}Ga_{0.85}N$ layer) having a thickness of about 2 $\mu$m, a channel layer 63 made of $n^+$-type gallium nitride (GaN) highly doped with silicon having a thickness of about 15 nm, and an insulating layer 64 made of undoped aluminum nitride (AlN) having a thickness of about 5 nm are sequentially grown on the principal plane of the introduced mother substrate 11. Then, after the epitaxial substrate is taken out of the reaction chamber of the MOVPE apparatus, the mother substrate 11 is irradiated with laser light 80 from the surface opposite to the semiconductor layer 62, so that a thermally decomposed layer 62a obtained by thermally decomposing the semiconductor layer 62 is formed at the interface of the semiconductor layer 62 with the mother substrate 11. As the laser light 80, KrF excimer laser light is used in this embodiment. The irradiation energy at this time is about 0.3 J/cm$^2$, the interval between pulses is about 5 ns, and the spot diameter of the laser light during irradiation is about 100 μm. The laser light 80 is absorbed in the semiconductor layer 62, and this absorption causes the semiconductor contact layer 62 to be thermally decomposed into metal gallium and nitrogen gas. Therefore, when the entire surface of the semiconductor layer 62 is scanned by the laser light 80, the mother substrate 11 and the semiconductor layer 62 are attached by the thermally decomposed layer 62a, as shown in FIG. 8B. In this case, the value of the irradiation energy of the laser light 80 is set to about 0.1 $J/cm^2$ or more and about 20 $J/cm^2$ or less, so that the mother substrate 11 and the semiconductor layer 62 are not completely separated. The channel layer 63 and the insulating layer 64 can be regrown after the thermally decomposed layer 62a is formed.

Figure 8C:
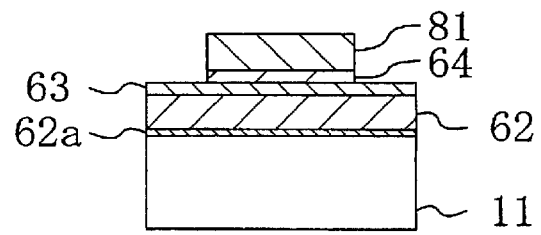

Next, as shown in FIG. 8C, the a mask film 81 made of silicon oxide is selectively formed so as to expose source and drain formation regions on the insulating layer 64. Then, using the formed mask film 81, the insulating layer 64 is dry-etched with, for example, a chlorine ($Cl_2$) gas, so that the channel layer 63 is exposed for the source and drain formation regions.

Figure 8D:
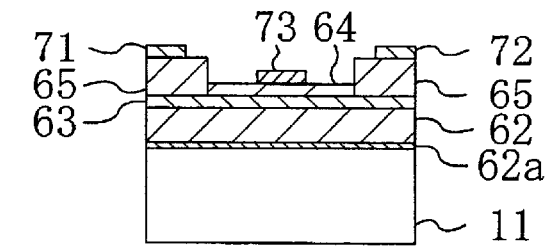
Figure 8E:
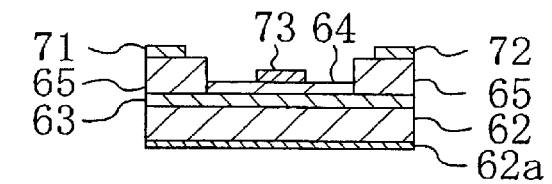

Next, as shown in FIG. 8D, the epitaxial substrate provided with the mask film 81 is introduced again to the reaction chamber of the MOVPE apparatus. Subsequently, using the mask film 81 as a mask for selective growth, a contact layer 65 made of $n^+$-type gallium nitride highly doped with silicon having a thickness of about 150 nm is regrown on the exposed source and drain formation regions in the channel layer 63. Thereafter, the epitaxial substrate in which the contact layer 65 has been grown is taken out of the reaction chamber, and then ohmic electrodes formed of a laminated film of titanium (Ti), aluminum (Al) and gold (Au) are formed selectively on the source and drain formation regions in the contact layer 65 by an evaporation method. Thereafter, annealing is performed in a nitrogen atmosphere, so that a source electrode 71 and a drain electrode 72 are formed. Subsequently, a Schottky electrode formed of a laminated film of aluminum (Al), platinum (Pt) and gold (Au) is selectively formed on the central portion of the insulating layer 64 and is used as a gate electrode 73.

Next, although not shown, a holding material made of an adhesive tape material, a glass material, a resist material or other materials that are hardly dissolved in hydrochloric acid is attached (applied) onto the epitaxial substrate including the source electrode 71 and the drain electrode 72 in order to facilitate the handling of the epitaxial layer after the mother substrate 11 is removed. Thereafter, the thermally decomposed layer 62a is removed with hydrochloric acid, so that the mother substrate 11 is separated from the semiconductor layer 62. Then, using a dicer, a HFET shown in FIG. 8E can be obtained by dividing the epitaxial layer into chips. The holding material is removed before or after the process for dividing the epitaxial layer in the form of a wafer into chips.

As described above, also in the HFET of the eighth embodiment, the first semiconductor layer (semiconductor layer 62) is grown on the mother substrate 11, and then the first semiconductor layer is irradiated with the laser light 80 that can thermally decompose the first semiconductor layer from the side of mother substrate 11. Thus, the thermally decomposed layer 62a for attaching the interfaces of the mother substrate 11 and the first semiconductor layer while breaking the joining of the mother substrate 11 and the first semiconductor layer is formed. Thus, in the cooling process after the growth of the contact layer shown in FIG. 8D, the stress caused by the difference in the thermal expansion coefficient between the mother substrate 11 and the first semiconductor layer can be reduced.

Furthermore, in the HFET of the eighth embodiment, the mother substrate 11 made of sapphire having a small thermal conductivity is removed, so that the heat release properties during operation are considerably improved, and the MESFET can be operate stably.

In the first to eighth embodiments, the same effects can be obtained with the following substitution.

First, as the laser light source for separating the mother substrate 11 from the epitaxial layer, the third harmonics of Nd:YAG laser light or KrF excimer laser light is used, but the present invention is not limited thereto. More specifically, any laser light that has a wavelength corresponding to energy larger than the absorption edge of a nitride semiconductor and is transparent with respect to the mother substrate 11 can be used. For example, excimer laser light with xenon chloride (XeCl) having an oscillation wavelength of 308 nm, or the fourth harmonics of YAG laser light can be used to separate the mother substrate 11.

Furthermore, the mask film 81 is made of silicon oxide, but any materials that substantially prevent a nitride semiconductor from being grown thereon can be used. For example, nitrides such as silicon nitride ($Si_xN_y$), oxides such as titanium oxide ($TiO_x$) and zirconium oxide ($ZrO_x$), or metals having a high melting point such as nickel (Ni), molybdenum (Mo) or tungsten (W) can be used.

Furthermore, in the third to seventh embodiments, the type of the conductivity can be interchanged between the n-type nitride semiconductor layer and the p-type nitride semiconductor layer.

Furthermore, for the semiconductor device to be produced, there is no limitation to a light-emitting device, a semiconductor laser device, a surface-light-emitting laser device, or a HFET, but light-receiving devices such as photoconductive cells or hetero-junction photodiodes, electronic devices such as MISFETs, JFETs or HEMTs, or filter devices can be produced in the same method as above.

What is claimed is:

1. A method for producing a semiconductor device comprising:
    a first step of forming a first semiconductor layer on a mother substrate;
    a second step of forming a thermally decomposed layer by irradiating the mother substrate with irradiation light from a surface opposite to the first semiconductor layer, thereby thermally decomposing a part of the first semiconductor layer, the thermally decomposed layer reducing a stress applied from the mother substrate of the first semiconductor layer and attaching the first semiconductor layer and the mother substrate; and
    a third step of forming a second semiconductor layer including an active layer on the first semiconductor layer which is held in the mother substrate by the thermally decomposed layer.

2. The method for producing a semiconductor device according to claim 1, further comprising a fourth step, between the first step and the second step, of forming a mask film on the first semiconductor layer, the mask layer being made of a material that substantially prevents the second semiconductor layer from being grown and having a plurality of openings.

3. The method for producing a semiconductor device according to claim 1, further comprising a fourth step, before the first step, of forming a mask film on the mother substrate, the mask layer being made of a material that substantially prevents the first semiconductor layer from being grown and having a plurality of openings.

4. The method for producing a semiconductor device according to claim 1, further comprising a fifth step, after the third step, of separating the mother substrate from the first semiconductor layer by removing the thermally decomposed layer.

5. The method for producing a semiconductor device according to claim 4, further comprising a sixth step, after the fifth step, of forming an electrode on a surface of the first semiconductor layer opposite to the second semiconductor layer.

6. The method for producing a semiconductor device according to claim 1, wherein the first semiconductor layer is made of a compound semiconductor containing a nitride.

7. The method for producing a semiconductor device according to claim 1, wherein the second semiconductor layer is made of a compound semiconductor containing a nitride.

8. The method for producing a semiconductor device according to claim 1, wherein the first semiconductor layer is a contact layer of the second semiconductor layer.

9. The method for producing a semiconductor device according to claim 1, wherein the first semiconductor layer is a cladding layer of the second semiconductor layer.

10. The method for producing a semiconductor device according to claim 1, wherein the first semiconductor layer is a compound semiconductor made of a p-type nitride.

11. The method for producing a semiconductor device according to claim 1, wherein an irradiation energy of the irradiation light is about 0.1 $J/cm^2$ or more and about 20 $J/cm^2$ or less.

12. The method for producing a semiconductor device according to claim 11, wherein a wavelength of the irradiation light is longer than an absorption edge of a forbidden band of a material constituting the mother substrate and is shorter than an absorption edge of a forbidden band of a material constituting the first semiconductor layer.

* * * * *